(12) United States Patent
Adamovich et al.

(10) Patent No.: US 7,151,339 B2
(45) Date of Patent: Dec. 19, 2006

(54) OLED EFFICIENCY BY UTILIZATION OF DIFFERENT DOPING CONCENTRATIONS WITHIN THE DEVICE EMISSIVE LAYER

(75) Inventors: Vadim Adamovich, Lawrenceville, NJ (US); Michael Weaver, Princeton, NJ (US); Julia Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 341 days.

(21) Appl. No.: 10/769,599

(22) Filed: Jan. 30, 2004

(65) Prior Publication Data

US 2005/0168137 A1 Aug. 4, 2005

(51) Int. Cl.
*H05B 33/00* (2006.01)
(52) U.S. Cl. .................... 313/504; 313/506; 428/690
(58) Field of Classification Search ........ 313/504–506; 428/690, 970
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,310,360 B1 | 10/2001 | Forrest et al. | |
| 6,337,102 B1 | 1/2002 | Forrest et al. | |
| 6,468,819 B1 | 10/2002 | Kim et al. | |
| 2002/0034656 A1 | 3/2002 | Thompson et al. | |
| 2002/0182441 A1 | 12/2002 | Lamansky et al. | |
| 2003/0072964 A1 | 4/2003 | Kwong et al. | |
| 2003/0230980 A1 | 12/2003 | Forrest et al. | |

FOREIGN PATENT DOCUMENTS

JP 2005108665 A * 4/2005

OTHER PUBLICATIONS

Baldo et al., "Highly Efficient Phosphorescent Emission from Organic Electroluminescent Devices", Nature, vol. 395, 151-154 (1998).
Baldo et al., "Very high-efficiency green organic light-emitting devices based on electropohosphorescence," Applied Physics Letters, vol. 75, No. 1, (1999).
Adachi et al., "Nearly 100% Internet Phosphorescent Efficiency in an Organic Light Emitting Device", J. Appl. Phys., 90, 5048 (2001).
Adachi, et al., "High-efficiency organic electrophosphorescent devices with tris (2-phenylpyridine) iridium doped into electron-transporting materials," Applied Physics Letters, Vo. 77, No. 6 (2000).
Baldo et al., <<Transient Analysis of organic electrophosphorescence : 1. Transient analysis of triplet energy transfer>>, Physical Review B, 2000, 62(16), pp. 10958-10966.

* cited by examiner

*Primary Examiner*—Joseph Williams
(74) *Attorney, Agent, or Firm*—Kenyon & Kenyon LLP

(57) ABSTRACT

The present invention relates to organic light emitting devices (OLEDs), and more specifically to an OLED device structure that provides improved performance characteristics, such as increased luminous efficiency and improved lifetime. The OLEDs of present invention comprise an emissive layer in which an emissive dopant is non-uniformly doped into a host material.

42 Claims, 12 Drawing Sheets

Al 1000Å
LiF 10Å
Alq$_3$ 400Å
BAlq 100Å
EML 300Å
NPD 300Å
CuPc 100Å
ITO

A

EML Sublayer 2
EML Sublayer 1

B

EML Sublayer 3
EML Sublayer 2
EML Sublayer 1

C

Concentration Gradient

D

EML Sublayer 3
EML Sublayer 2
EML Sublayer 1

Ir(Ph-ppy)

Ir(3-Mepq)₂(acac)

Ir(ppy)₃

CBP

α-NPD

BAlq

Alq₃

CuPc

OLED EFFICIENCY BY UTILIZATION OF DIFFERENT DOPING CONCENTRATIONS WITHIN THE DEVICE EMISSIVE LAYER

FIELD OF THE INVENTION

The present invention relates to organic light emitting devices (OLEDs), and more specifically to an OLED device structure that provides improved performance characteristics, such as increased luminous efficiency and improved lifetime.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

Typically electrophosporescent OLEDs are comprised of several layers so as to achieve an optimal combination of OLED performance characteristics. Many of the known OLEDs have relatively short operational lifetimes before their luminance drops to a fraction of its initial value. Often there is a tradeoff between higher brightness or efficiency and device lifetime. Thus, there is a need for device structures that provide improved device performance while maintaining or improving device lifetime.

SUMMARY OF THE INVENTION

Organic light emitting devices are provided wherein the emissive layer has a non-uniform concentration of an emissive dopant in a host material. The concentration of the emissive material varies across the emissive layer. In one embodiment of the invention, the emissive layer may be comprised of multiple sublayers, each doped with different concentrations of the emissive dopant. Alternatively, the emissive layer may be comprised of a single layer having a continuous concentration gradient of the emissive dopant.

In one embodiment, a light emitting device is provided, having an anode, a cathode and an emissive layer disposed between and electrically connected to the anode and the cathode. The emissive layer comprises a host material and an emissive material, present as a dopant in the host material. The concentration of the emissive dopant is higher on one side of the emissive layer (EML), either the anode-side or the cathode-side. The higher concentration on one side of the emissive layer may facilitate charge injection and utilization. The lower concentration of the emissive dopant on the opposite side of the emissive layer may reduce exciton quenching.

In one embodiment, the invention provides an organic light emitting device comprising an emissive layer disposed between and electrically connected to an anode and a cathode, wherein the emissive layer comprises a host material and a phosphorescent emissive material, and wherein the concentration of the phosphorescent emissive material in the host material on the anode-side of the emissive layer is about 1% to about 50%, and the concentration of the phosphorescent emissive material in the host material on the cathode-side of the emissive layer is about 0.5% to about 20%. The difference between the concentrations of the phosphorescent emissive material on the anode-side of the emissive layer and the cathode side of the emissive layer are at least about 0.5%. In an alternative embodiment, the ratio of the concentrations of the phosphorescent emissive material on the anode-side of the emissive layer to that on the cathode side of the emissive layer is at least about 1.25:1.

In another embodiment, the invention provides an organic light emitting device comprising an emissive layer disposed between and electrically connected to an anode and a cathode, wherein the emissive layer comprises a host material and a phosphorescent emissive material, and wherein the concentration of the phosphorescent emissive material in the host material on the cathode-side of the emissive layer is about 1% to about 50%, the concentration of the phosphorescent emissive material in the host material on the anode-side of the emissive layer is about 0.5% to about 20%, and the difference between the concentrations of the phosphorescent emissive material on the cathode-side of the emissive layer and the anode-side of the emissive layer is at least about 0.5%. In an alternative embodiment, the ratio of the concentrations of the phosphorescent emissive material on the cathode-side of the emissive layer to that on the anode-side of the emissive layer is at least about 1.25:1.

In another embodiment, the invention provides an organic light emitting device comprising an emissive layer disposed between and electrically connected to an anode and a cathode, wherein the emissive layer comprises a host material and a phosphorescent emissive material, and wherein the emissive layer comprises at least three sublayers. The first sublayer is on the anode-side of the emissive layer, the third sublayer is on the cathode-side of the emissive layer and the second sublayer is disposed between the first sublayer and the third sublayer. The concentration of the phosphorescent emissive material in the host material within the first sublayer and the third sublayer is independently about 1% to about 50%. The concentration of the phosphorescent emissive material in the second sublayer is about 0.5% to about 20%. The difference between the concentrations of the phosphorescent emissive material in the first sublayer and in the second sublayer is at least about 0.5%, wherein the first sublayer has a higher concentration of the phosphorescent emissive material than the second sublayer. The difference between the concentrations of the phosphorescent emissive material in the third sublayer and the second sublayer is at least about 0.5%, wherein the third sublayer has a higher concentration of the phosphorescent emissive material than the second sublayer. In an alternative embodiment, the ratio of the concentration of the phosphorescent emissive material in the first sublayer to that in the second sublayer is at least about 1.25:1, and the ratio of the concentrations of the phosphorescent emissive material in the third sublayer to that in the second sublayer is at least about 1.25:1.

DETAILED DESCRIPTION

Figure 1:
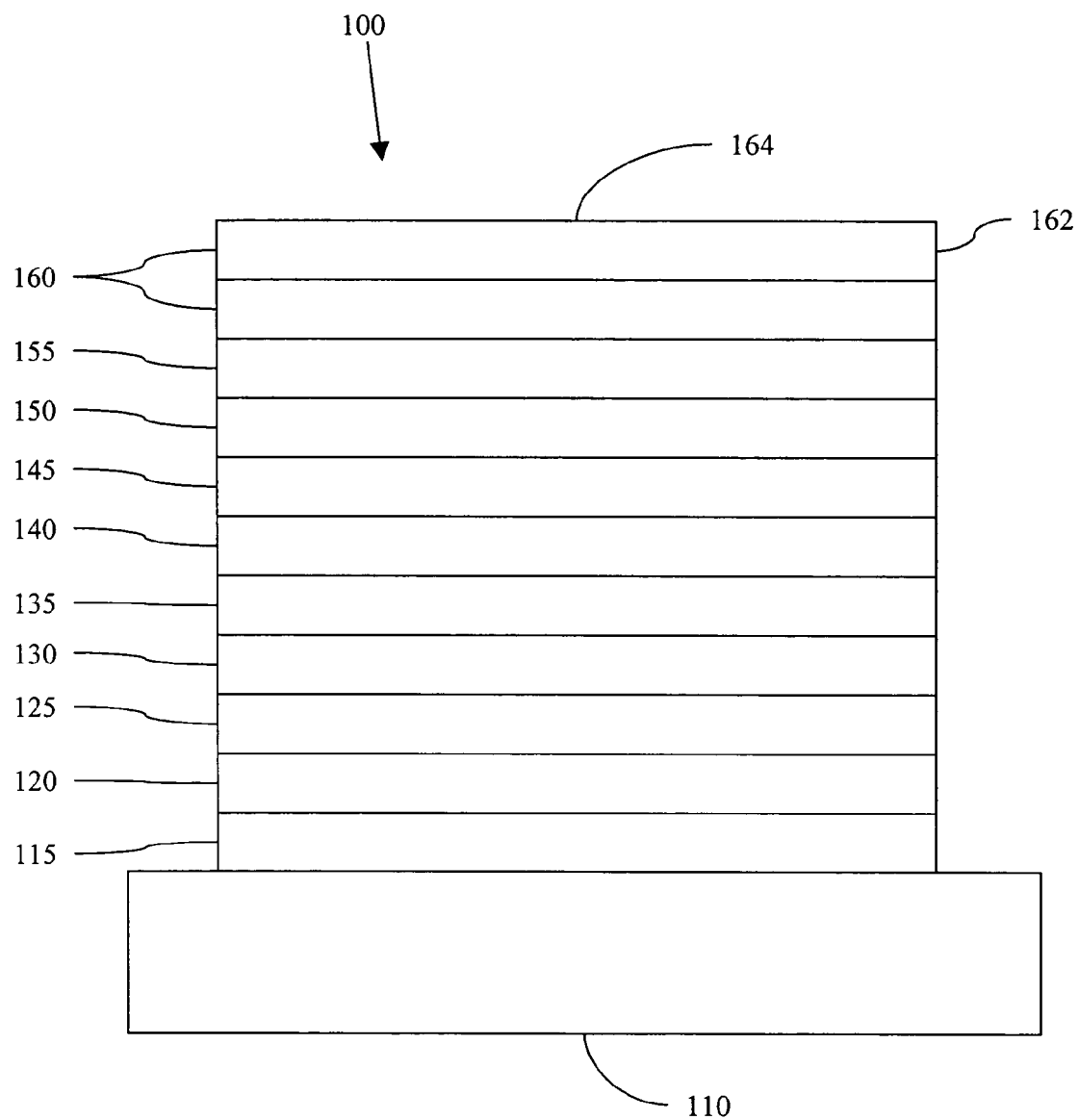
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 3, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III). Representative emissive layers include phosphorescent organometallic materials such as disclosed in U.S. Pat. Nos. 6,303,238 and 6,310,360; and U.S. patent application Publication Nos. 2002-0034656; 2002-0182441; and 2003-0072964; and WO-02/074015, each of which is incorporated herein by reference in their entirety.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Other hole transport layers may be used.

Emissive layer 135 comprises an organic dopant material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 also comprises a host material into which the emissive material is doped. In the devices of the present invention, the emissive layer has a non-uniform doping concentration of the emissive material in the host material. Thus, in one embodiment of the invention, the concentration of the emissive material is higher on the cathode-side of emissive layer and lower on the anode-side of the emissive layer. In another embodiment of the invention, the concentration of the emissive material is higher on the anode-side of emissive layer and lower on the cathode-side of the emissive layer.

Emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(Ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 140 may include a material capable of transporting electrons. Electron transport layer 140 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficienly of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and U.S. patent application Ser. No. 10/173,682 to Forrest et al., which are incorporated by reference in their entireties.

When a first HOMO (LUMO) energy level is greater in value, i.e. higher in energy, than a second HOMO (LUMO) energy level it is further from the vacuum energy level and appears "lower down" on a schematic energy level diagram (closer the bottom of the diagram). A HOMO level that is closer to the vacuum level is generally a better conductor of holes. A LUMO level that is farther from the vacuum level is generally a better conductor of electrons.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm, or greater, may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
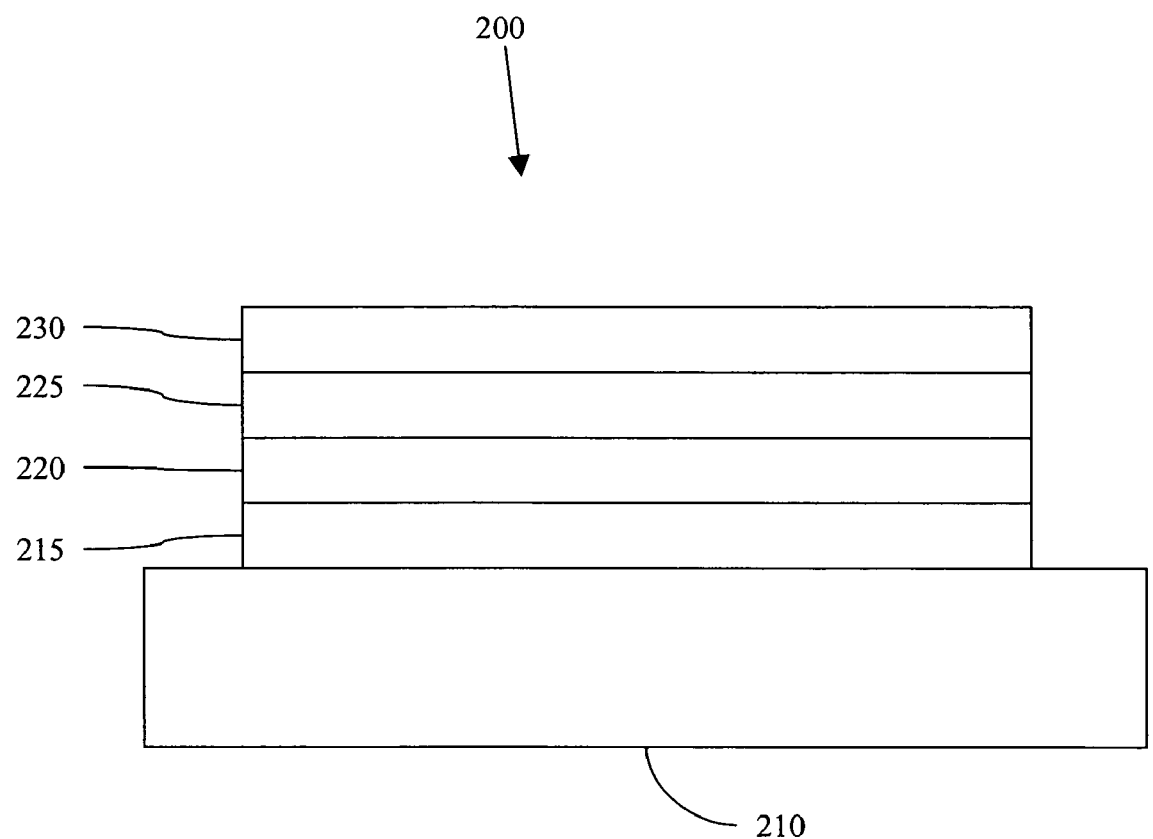
FIG. 2 shows an inverted organic light emitting device that does not have a separate electron transport layer.
Figure 3:
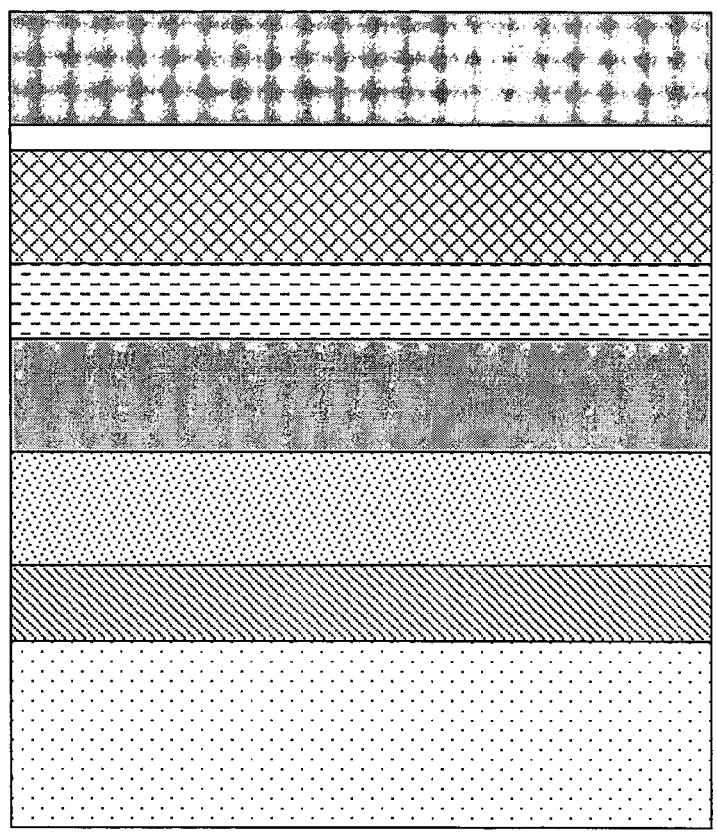
FIG. 3 shows a schematic drawing of a phosphorescent OLED according to an embodiment of the invention.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

As used herein, "solution processible" means capable of being dissolved, dispersed, or transported in and/or deposited from a liquid medium, either in solution or suspension form.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20–25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

There is generally a trade off between efficient charge utilization, which may occur at higher emissive dopant concentrations, and exciton quenching that may also occur at higher dopant concentration. The optimum concentration for the charge utilization may be different from the optimal concentration to avoid exciton quenching. When the emissive dopant concentration is increased, it may cause triplet exciton quenching due to triplet-triplet annihilation and triplet-polaron annihilation, etc. (Baldo, M. A. and Forrest, S. R., *Physical Review B*, 2000, 62(16), 10958). This may explain the drop in efficiency of phosphorescent devices with increasing current. Higher dopant concentration may increase the quenching and decrease the efficiency (Baldo, M. A.; O'Brien, D. F.; You, Y.; Shoustikov, A.; Sibley, S.; Thompson, M. E.; Forrest, S. R. *Nature* 1998, 395, 151, Baldo, M. A.; Lamansky, S.; Burrows, P. E.; Thompson, M. E.; Forrest, S. R. *Appl. Phys. Lett.* 1999, 75(1), 4.). Very high concentration of excitons caused by a high dopant concentration in the emissive layer may decrease the efficiency of fluorescent OLEDs as well. The present invention provides for the use of different dopant concentrations in the emissive layer to optimize the charge utilization and to avoid quenching.

In the devices of the present invention, the emissive layer has a non-uniform concentration of the emissive dopant in the host material. The concentration of the emissive material is varied throughout the emissive layer. In one embodiment, the concentration of the emissive dopant will be higher on one side of the emissive layer (either the anode-side or the cathode-side) to facilitate charge utilization. The maximum concentration of the emissive dopant in the emissive layer may be between about 1% to about 50%, preferably between about 5% to about 20%, and more preferably between about 6% to about 12%. On the opposite side of the emissive layer the concentration of the emissive dopant will be lower in order to avoid exciton quenching. The minimum concentration of the emissive dopant in the emissive layer may be about 0.5% to about 20%, preferably about 1% to about 6%, and more preferably from about 2% to about 4.5%. In one embodiment, the difference between the maximum concentration and the minimum concentration of the emissive dopant in the emissive layer is at least about 0.5%. In another embodiment, the ratio of the maximum concentration and the minimum concentration of the emissive dopant in the emissive layer is at least about 1.25:1. All values for % concentration are by weight unless otherwise indicated.

Figure 5:
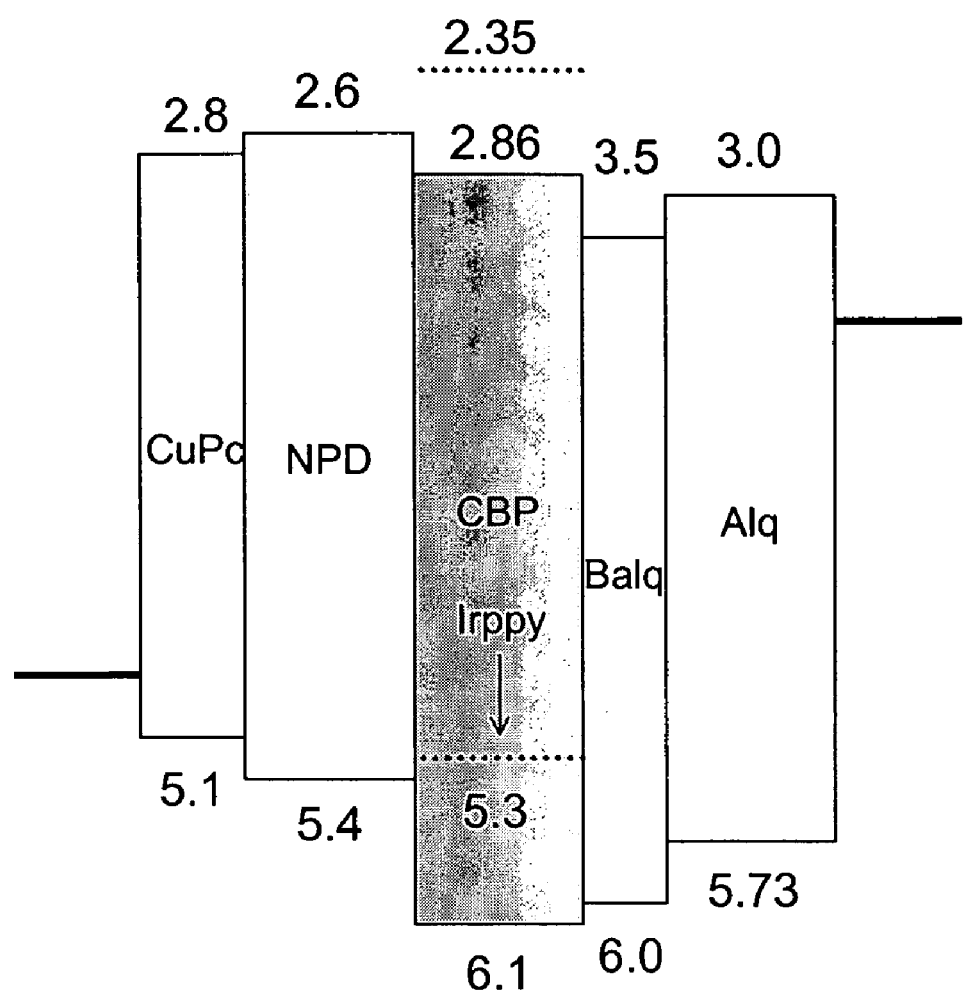
FIG. 5 shows a schematic energy level diagram of the phosphorescent OLED having the device structure of FIG. 3 in which the emissive layer comprises a CBP host and Irppy dopant.

In one embodiment of the invention, the concentration of the emissive material is higher on the anode-side of emissive layer and lower on the cathode-side of the emissive layer. In this embodiment, the higher concentration of emissive dopant on the anode-side of the emissive layer may facilitate the utilization of holes in the emissive layer. The energy level diagram of an example of this embodiment is depicted in FIG. 5. According to the energy level diagram of the OLED structure, the emissive dopant (Irppy) in the emissive layer primarily caries holes and the host (CBP) primarily carries electrons due primarily to their respective HOMO and LUMO energies. The facilitation of hole injection into the emissive layer, and their more efficient utilization, may be achieved by increasing the dopant concentration on the anode-side of the emissive layer. On the other hand, the lower emissive dopant concentration on the cathode-side of the emissive layer may facilitate electron injection and more efficient electron utilization, and may reduce exciton quenching. Reduced exciton quenching is a possibility due to the larger average distance between dopant sites in the low doped layer versus the high doped layer. This reduces the possibility of 'self quenching.' Also the device architecture may increase the average distance between the exciton recombination zone and the potentially quenching layers adjacent to the emissive layer.

In another embodiment of the invention, the concentration of the emissive material is higher on the cathode-side of emissive layer and lower on the anode-side of the emissive layer. This embodiment may be utilized when the emissive dopant is a primary transporter of electrons in the emissive layer. In this embodiment, the higher concentration of emissive dopant on the cathode-side of the emissive layer may facilitate the utilization of electrons in the emissive layer.

The facilitation of electron injection into the emissive layer, and their more efficient utilization, may be achieved by increasing the dopant concentration on the cathode-side of the emissive layer. On the other hand, the lower emissive dopant concentration on the anode-side of the emissive layer may facilitate hole injection and more efficient hole utilization, and may reduce exciton quenching.

Figure 4:
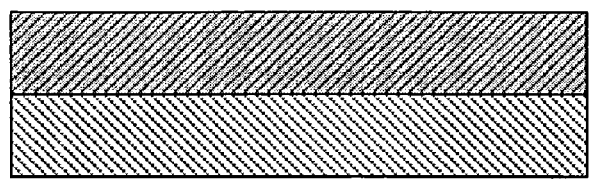
FIG. 4 shows three possible configurations for the emissive layer (EML) for phosphorescent OLEDs according to various embodiments of the invention. (A) depicts an emissive layer having two sublayers, (B) depicts an emissive layer having three sublayers, (C) depicts an emissive layer having a concentration gradient of the phosphorescent dopant, and (D) depicts an emissive layer having three sublayers, wherein the concentration of the emissive dopant is greater in the first sublayer and the third sublayer than in the second sublayer.
Figure 4:
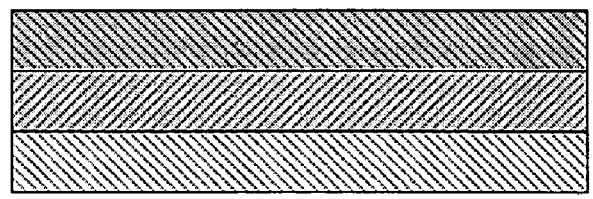
Figure 4:
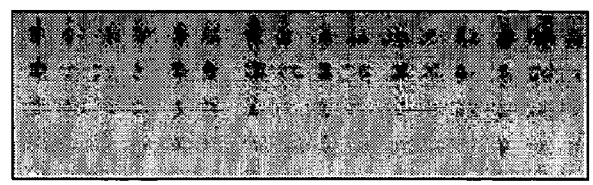
Figure 4:
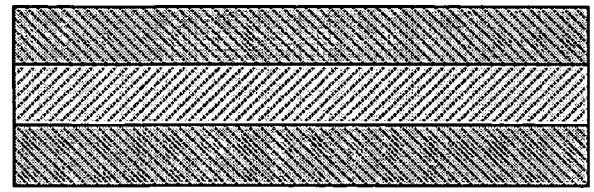

In one embodiment of the invention, the emissive layer may be comprised of multiple sublayers, each doped with different concentrations of the emissive dopant. Alternatively, the emissive layer may be comprised of a single layer having a continuous concentration gradient of the emissive dopant. For Example, FIG. 4 shows three possible configurations for the emissive layer for OLEDs according to various embodiment of the invention. FIG. 4A depicts an emissive layer having two sublayers in which one sublayer has a higher concentration of the emissive dopant and the other sublayer has a lower concentration of the emissive dopant. FIG. 4B depicts an emissive layer having three sublayers having a higher concentration, an intermediate concentration and a lower concentration of the emissive dopant. FIG. 4C depicts an emissive layer having a continuous concentration gradient of the emissive dopant.

In a preferred embodiment, the emissive layer is comprised of two doped sublayers, each sublayer doped with a different concentration of a phosphorescent emissive dopant. The sublayer having the higher dopant concentration may be located on the anode-side of the emissive layer (to facilitate hole injection), and the sublayer having the lower dopant concentration may be located on the cathode-side of the emissive layer. This embodiment may be utilized when the emissive dopant is a primary transporter of holes in the emissive layer. In another embodiment of the invention the sublayer having the higher dopant concentration may be located on the cathode-side of the emissive layer (to facilitate electron injection), and the sublayer having the lower dopant concentration may be located on the anode-side of the emissive layer. This embodiment may be utilized when the emissive dopant is a primary transporter of electrons in the emissive layer. In a preferred embodiment of the invention, the total thickness of the emissive layer is less than about 1000 Å in thickness, and each sublayer has a thickness of greater than about 20 Å. In a further embodiment of the invention, the probability of charge recombination and exciton formation closer to the middle of the emissive layer (for example, at the interface of sublayer 1 and sublayer 2) is higher as compared to a corresponding uniformly doped emissive layer devices, where recombination mostly occurs at the interface between the emissive layer and adjacent layers (i.e., hole transport layer or blocking layer, or electron-transporter layer if blocking layer is omitted). As a result, the amount of excitons which may diffuse to the emissive layer/adjacent layer interface is much lower due to distribution of the exciton density around the exciton formation zone. Therefore, the probability of exciton quenching at the interface of the emissive layer with an adjacent layer is less. The thickness of the sublayers in which exciton formation primarily occurs should be selected to reduce the number of excitons that may diffuse to the interfaces with adjacent layers (ETL, HTL, blocking layer, etc.). In a preferred embodiment, the thickness of each of the sublayers should be about equal.

In another embodiment, the concentration of the phosphorescent emissive material in the emissive layer is higher at both boundaries of the emissive layer and lower in the central region of the emissive layer (i.e., the region away from the emissive layer boundaries). This embodiment may be preferred when the phosphorescent emissive material conducts both holes and electrons. The higher concentration of emissive dopant on the anode-side of the emissive layer may facilitate the utilization of holes in the emissive layer, and the higher concentration of emissive dopant on the cathode-side of the emissive layer may facilitate the utilization of electrons in the emissive layer. The lower concentration of the emissive dopant in the central region of the emissive layer may reduce exciton quenching. In this embodiment, the emissive layer may comprise at least three sublayers or regions, the first sublayer is on the anode-side of the emissive layer, the third sublayer is on the cathode-side of the emissive layer and the second sublayer is disposed between the first sublayer and the third sublayer. The concentrations of the phosphorescent emissive material in the host material within the first sublayer and the third sublayer are higher than the concentration of the phosphorescent emissive material in the second sublayer. FIG. 4D shows an emissive layer having three sublayers. The concentrations of the phosphorescent emissive material in the first sublayer and in the third sublayer may be the same or may be different. In one embodiment, the concentration of the phosphorescent emissive material in the host material within the first sublayer and the third sublayer is independently about 1% to about 50%. The concentration of the phosphorescent emissive material in the second sublayer is about 0.5% to about 20%. The difference between the concentrations of the phosphorescent emissive material in the host material in the first sublayer and in the second sublayer is at least about 0.5%. The difference between the concentrations of the phosphorescent emissive material in the host material in the third sublayer and the second sublayer are at least about 0.5%. In an alternative embodiment, the ratio of the concentrations of the phosphorescent emissive material in the host material in the first sublayer, second sublayer and third sublayer is at least about 1.25:1:1.25.

The differential doping of the emissive dopant in the emissive layer may allow for control of the exciton formation zone. By facilitating the injection of holes or electrons into the emissive layer, the zone of exciton recombination may be shifted within the emissive layer. It is generally preferred that the zone of exciton recombination occurs away from the boundaries of the emissive layer. In one embodiment, exciton formation occurs in a region of the emissive layer such that the distance from the region of exciton formation to the boundaries of the emissive layer is greater than 50% of the exciton diffusion length. However, it is generally preferred to have a thin emissive layer due to concerns over increasing the device voltage with increasing layer thickness. As a result, distances between the region of exciton formation and the boundaries of the emissive layer that are greater than 25% of the exciton diffusion length are also preferred, and more preferably 15% of the exciton diffusion length. In a preferred embodiment of the invention, the exciton formation occurs in a region of the emissive layer such that the distance from the primary region of exciton formation to the boundaries of the emissive layer is wide enough to reduce the number of excitons that may diffuse to the boundaries of the emissive layer without increasing the thickness of the emissive layer to such an extent that it substantially increase the device driving voltage. To avoid high device driving voltages, the thickness of the emissive layer is preferably less than about 40 nm, more preferably less than about 30 nm, and still more preferably less than about 20 nm. Preferred thickness ranges include about 5 nm to about 40 nm, and more preferably about 10 nm to about 30 nm.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

with an additional crystal monitor located close to the dopant evaporation source. The additional monitor was not exposed to the major flow of the host, which allowed increasing the precision of the dopant concentration. The cathode consists of 10 Å of LiF followed by 1,000 Å of Al. All devices were encapsulated with a glass lid sealed with an UV-cured epoxy resin in a nitrogen glove box (<1 ppm of $H_2O$ and $O_2$) immediately after fabrication, and a moisture getter was incorporated inside the package.

The devices were characterized after fabrication. Current-voltage measurements were performed using a Keithley 236 source-measure unit and a Keithley 2400 source. Spectra and light intensity were measured using a PhotoResearch 705 Model Spectroradiometer and calibrated photodiode.

| | |
|---|---|
| CBP: | 4,4'-N,N-dicarbazole-biphenyl |
| m-MTDATA | 4,4',4''-tris(3-methylphenylphenlyamino)triphenylamine |
| $Alq_3$: | 8-tris-hydroxyquinoline aluminum |
| Bphen: | 4,7-diphenyl-1,10-phenanthroline |
| n-BPhen: | n-doped BPhen (doped with lithium) |
| $F_4$-TCNQ: | tetrafluoro-tetracyano-quinodimethane |
| p-MTDATA: | p-doped m-MTDATA (doped with $F_4$-TCNQ) |
| $Ir(ppy)_3$, Irppy: | tris(2-phenylpyridine)-iridium |
| $Ir(ppz)_3$: | tris(1-phenylpyrazoloto,N,C(2')iridium(III) |
| $Ir(Ph-ppy)_3$, IrPh-ppy: | iridium(III)tris(2-[3-phenyl]pyridine) |
| $Ir(3-Mepq)_2(acac)$: | iridium(III)bis[2-(3-methyl-2-quinolinyl)-'N]phenyl-'C](2,4-pentanedionato-'O,'O'), |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine |
| ITO: | indium tin oxide |
| NPD: | N,N'-diphenyl-N-N'-di(1-naphthyl)-benzidine |
| TPD: | N,N'-diphenyl-N-N'-di(3-toly)-benzidine |
| BAlq: | aluminum(III)bis(2-methyl-8-quinolinato)4-phenylphenolate |
| mCP: | 1,3-N,N-dicarbazole-benzene |
| DCM: | 4-(dicyanoethylene)-6-(4-dimethylaminostyryl-2-methyl)-4H-pyran |
| DMQA: | N,N'-dimethylquinacridone |
| PEDOT:PSS: | an aqueous dispersion of poly(3,4-ethylenedioxythiophene) with polystyrenesulfonate (PSS) |

EXPERIMENTAL

Specific representative embodiments of the invention will now be described, including how such embodiments may be made. It is understood that the specific methods, materials, conditions, process parameters, apparatus and the like do not necessarily limit the scope of the invention.

Device Fabrication

Devices were fabricated in high vacuum (<$10^{-7}$ Torr) by thermal evaporation. Indium tin oxide (ITO) anode on glass was used as the anode. Organic layers were sequentially deposited at the rate of approximately 2–3 Å/s. The rate of a single-component layer was controlled with thickness monitor located close to the substrate. For the two-component emissive layer the rate of the dopant was controlled

EXAMPLE 1

Phosphorescent OLEDs were fabricated having the device structure ITO/CuPc(100 Å)/NPD(300 Å)/emissive layer (300 Å)/BAlq(100 Å)/$Alq_3$(400 Å)/LiF(10 Å)/Al(1000 Å). The emissive layer comprised two doped sublayers (EML1 and EML2), each with a CBP host doped with different concentrations of the phosphorescent dopant, $Ir(Ph-ppy)_3$. For comparison, devices were fabricated having only EML1, wherein EML1 was a single, uniformly doped emissive layer of $Ir(Ph-ppy)_3$ doped into CBP. In the devices having two emissive sublayers, sublayer EML1 was located on the anode-side of the emissive layer and sublayer EML2 was located on the cathode side of the emissive layer. The dopant concentration, layer thickness, and device performance of the $Ir(Ph-ppy)_3$/CBP devices are summarized and shown in Table 1:

TABLE 1

| | | | | | Maximum luminous efficiency (max. cd/A) | | | |
|---|---|---|---|---|---|---|---|---|
| device | EML1 thickness, Å | EML2 thickness, Å | V at 10 mA/$cm^2$ | Efficiency Cd/A | at voltage, v | at current density, mA/$cm^2$ | at luminance, cd/$m^2$ |
| 1 | 6%, 150 Å | 3%, 150 Å | 9.87 | 28.14 | 6.4 | 0.173 | 48.6 |
| 2 | 9%, 150 Å | 3%, 150 Å | 9.74 | 28.31 | 6.6 | 0.243 | 68.7 |

TABLE 1-continued

| device | EML1 thickness, Å | EML2 thickness, Å | V at 10 mA/cm² | Efficiency Cd/A | at voltage, v | at current density, mA/cm² | at luminance, cd/m² |
|---|---|---|---|---|---|---|---|
| 3 | 12%, 150 Å | 3%, 150 Å | 9.67 | 28.09 | 7 | 0.468 | 131 |
| 4 | 4.5%, 300 Å | — | 9.95 | 25.45 | 8.4 | 2.54 | 647 |
| 5 | 6%, 300 Å | — | 9.70 | 24.13 | 10.6 | 20.1 | 4850 |
| 6 | 9%, 300 Å | — | 9.46 | 19.63 | 11.8 | 56.0 | 11000 |
| 7 | 12%, 300 Å | — | 9.41 | 14.48 | 12.4 | 12.4 | 13600 |
| 8 | 6%, 150 Å | 4.5%, 150 Å | 9.85 | 28.65 | 8.8 | 4.00 | 1150 |
| 9 | 9%, 150 Å | 4.5%, 150 Å | 9.72 | 28.3 | 8.8 | 4.38 | 1240 |
| 10 | 12%, 150 Å | 4.5%, 150 Å | 9.63 | 27.82 | 8.6 | 3.79 | 1050 |
| 11 | 9%, 50 Å | 2%, 250 Å | 10.14 | 26.71 | 6.2 | 0.092 | 24.6 |
| 12 | 9%, 100 Å | 2%, 200 Å | 10.04 | 27.79 | 8.8 | 3.38 | 940 |
| 13 | 9%, 200 Å | 2%, 100 Å | 9.74 | 27.65 | 8.6 | 3.5 | 969 |

As shown in Table 1, higher luminous efficiency (Cd/A) was observed in all of the tested devices having an emissive layer comprised of two emissive sublayers when compared to the devices having a single uniform emissive layer. In the devices with two emissive sublayers (EML1 and EML2), a higher dopant concentration was located in EML1, the emissive sublayer positioned closest to the hole transporting layer(s) of the device to facilitate hole injection while the lower dopant concentration was located in EML2, the emissive sublayer positioned closest to the electron transport layers of the device, where recombination mostly occurs, in order to facilitate electron injection and reduce exciton quenching. Adjusting the concentration of the emissive dopant in sublayer EML2 from 3% to 4.5% shifted the maximum efficiency to higher brightness (measured as luminance, Cd/A) and also results in a 0.02 V decrease in voltage. Without being bound to any particular theory, it is believed that the observed shift in maximum efficiency to higher brightness was the result of shifting the recombination zone closer to the electron transport layer (ETL) interface. Increasing the thickness of sublayer EML1 also shifted the maximum efficiency to higher brightness. Overall, providing the devices tested with an emissive layer comprised of two doped sublayers, a variation of sublayer thicknesses from 50 to 250 Å and dopant concentrations from 2% to 12% resulted in OLEDs with higher efficiency as compared to devices with a single uniformly doped emissive layer.

Figure 6:
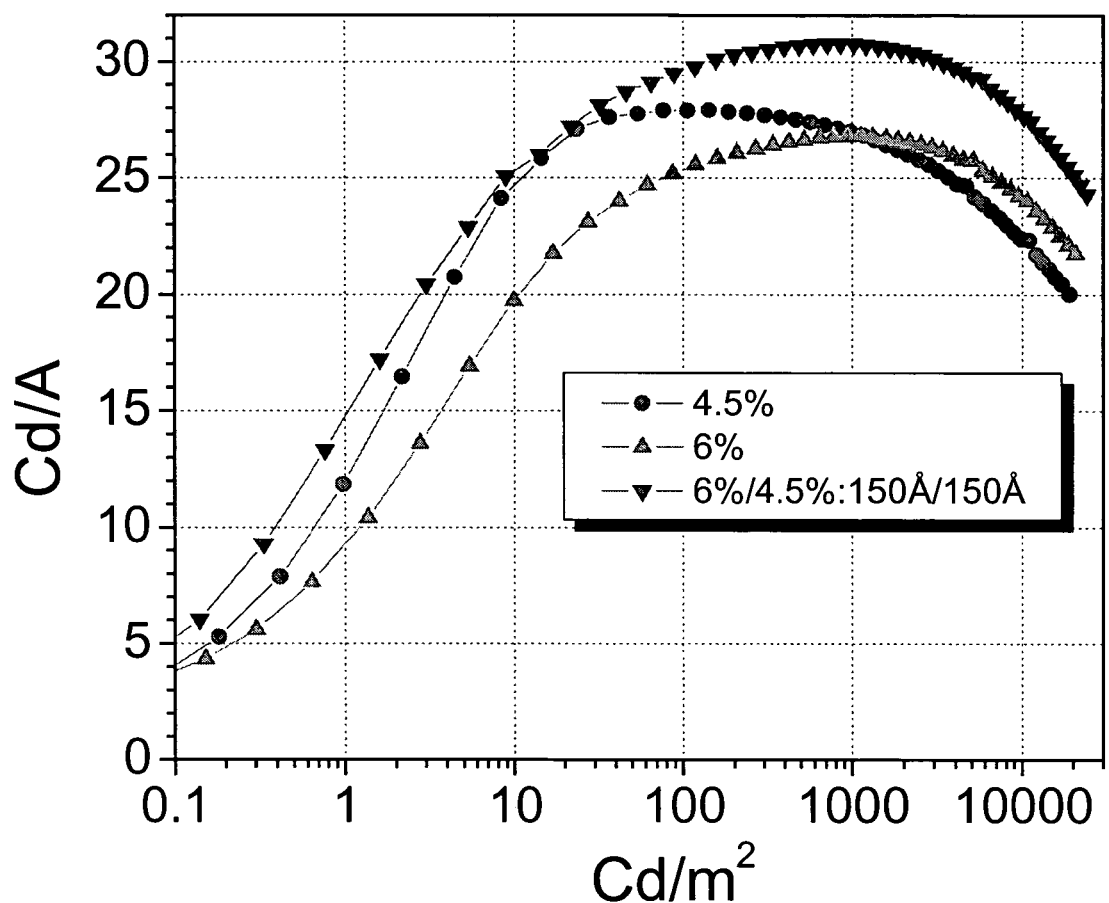
FIG. 6 shows the plot of luminous efficiency (Cd/A) vs luminance (Cd/m$^2$) for Ir(Ph-ppy)$_3$/CBP OLEDs having the device structure ITO/CuPc(100 Å)/NPD(300 Å)/emissive layer (300 Å)/BAlq(100 Å)/Alq$_3$(400 Å)/LiF(10 Å)/Al(1000 Å) in which the emissive layer is (i) 4.5% Ir(Ph-ppy)$_3$:CBP (300 Å), (ii) 6% Ir(Ph-ppy)$_3$:CBP(300 Å), or (iii) two sublayers having the structure 6% Ir(Ph-ppy)$_3$:CBP(150 Å)/4.5% Ir(Ph-ppy)$_3$:CBP(150 Å).
Figure 8:
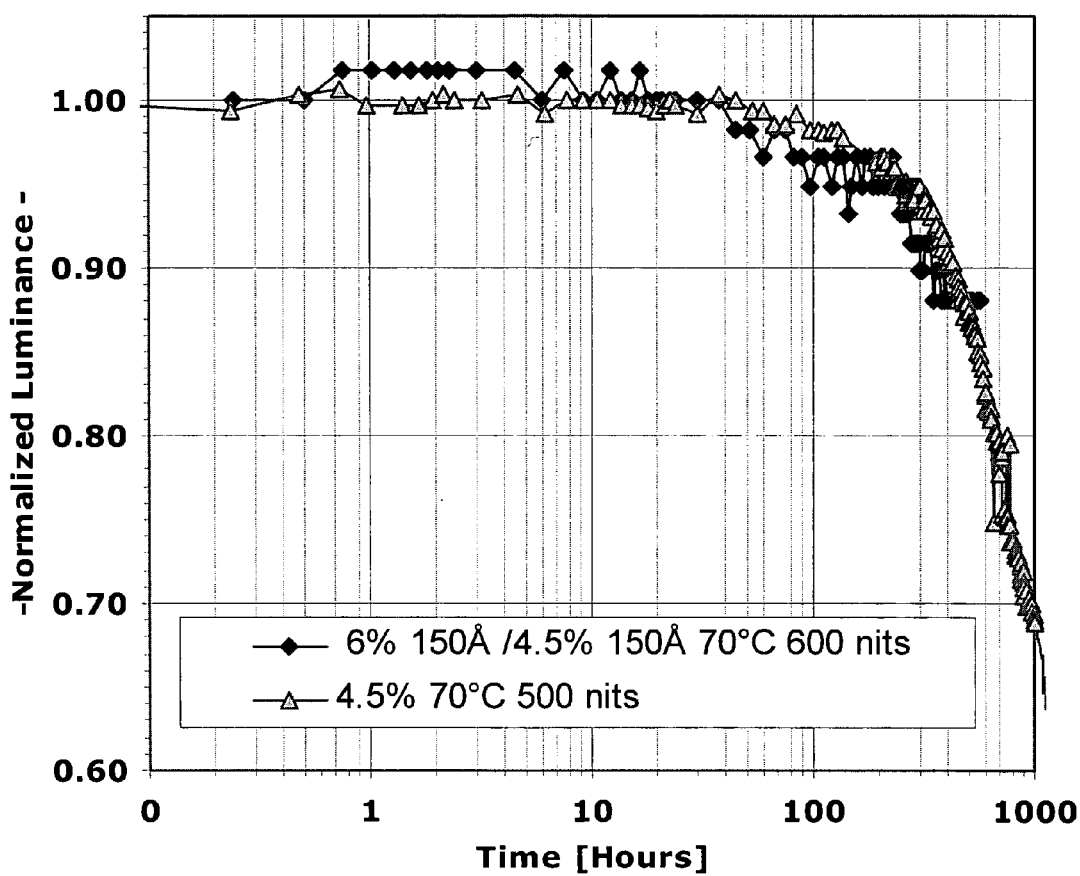
FIG. 8 shows the plot of the luminance (normalized to the initial luminance) vs operation time at 70° C. for Ir(Ph-ppy)$_3$/ CBP OLEDs having the device structure ITO/CuPc(100 Å)/NPD(300 Å)/emissive layer (300 Å)/BAlq (100 Å)/Alq$_3$(400 Å)/LiF(10 Å)/Al(1000 Å) in which the emissive layer is 6% Ir(Ph-ppy)$_3$:CBP(300 Å), or 6% Ir(Ph-ppy)$_3$:CBP(150 Å)/4.5% Ir(Ph-ppy)$_3$:CBP(150 Å) at an initial luminance of 500 Cd/m$^2$ and 600 Cd/m$^2$.

The efficiencies of selected Ir(Ph-ppy)$_3$/CBP devices are shown in the FIG. 6. FIG. 6 shows the plot of efficiency vs luminance for devices in which the emissive layer is (i) 4.5% Ir(Ph-ppy)$_3$:CBP (300 Å), (ii) 6% Ir(Ph-ppy)$_3$:CBP(300 Å), or (iii) two sublayers having the structure 6% Ir(Ph-ppy)$_3$:CBP(150 Å)/4.5% Ir(Ph-ppy)$_3$:CBP(150 Å). The operational stability of selected devices are shown in FIG. 8. FIG. 8 shows the plot of the luminance vs operation time at 70° C. for devices in which the emissive layer is 4.5% Ir(Ph-ppy)$_3$:CBP(300 Å), or 6% Ir(Ph-ppy)$_3$:CBP(150 Å)/4.5% Ir(Ph-ppy)$_3$:CBP(150 Å).

The OLEDs having an emissive layer comprised of the two doped sublayers, particularly the 6% 150 Å/4.5% 150 Å device, show superior efficiency as compared to standard devices having a uniform emissive dopant concentration. The lifetime of the devices with 6%/4.5% dopant concentration is comparable to that for control devices with 4.5% uniform dopant concentration. The thickness of the layers 150 Å/150 Å was found optimal for the Ir(Ph-ppy)$_3$:CBP devices.

EXAMPLE 2

Phosphorescent OLEDs were fabricated having the device structure ITO/CuPc(100Å)/NPD(300 Å)/emissive layer (300 Å)/BAlq(100 Å)/Alq$_3$(400 Å)/LiF(10 Å)/Al(1000 Å). The emissive layer is comprised of two doped sublayers, each with a CBP host doped with different concentrations of the phosphorescent dopant, Irppy. For comparison, devices were fabricated having a single uniformly doped emissive layer of Irppy doped into CBP. The Irppy/CBP devices are summarized in Table 2:

TABLE 2

| EML | V at 10 mA/cm² | Max Luminous Efficiency, Cd/A | | | | Max Power Efficiency Lm/W | |
|---|---|---|---|---|---|---|---|
| | | Cd/A | QE, % | at Cd/m² | | Lm/W | at Cd/m² |
| 6%$_{(300 Å)}$ | 9.50 | 23.4 | 6.50 | 611 | | 10.62 | 68 |
| 6%$_{(150 Å)}$/4.5%$_{(150 Å)}$ | 9.66 | 25.6 | 7.20 | 186 | | 12.80 | 36 |
| 4.5%$_{(150 Å)}$/6%$_{(150 Å)}$ | 10.4 | 19.1 | 5.34 | 298 | | 8.40 | 46 |
| 12%$_{(150 Å)}$/4.5%$_{(150 Å)}$ | 9.29 | 22.6 | 6.30 | 572 | | 10.70 | 59 |
| 6%$_{(200 Å)}$/4.5%$_{(100 Å)}$ | 9.64 | 24.1 | 6.76 | 460 | | 11.45 | 32 |
| 6%$_{(100 Å)}$/4.5%$_{(200 Å)}$ | 10.15 | 24.1 | 6.73 | 119 | | 12.14 | 21 |

Figure 7:
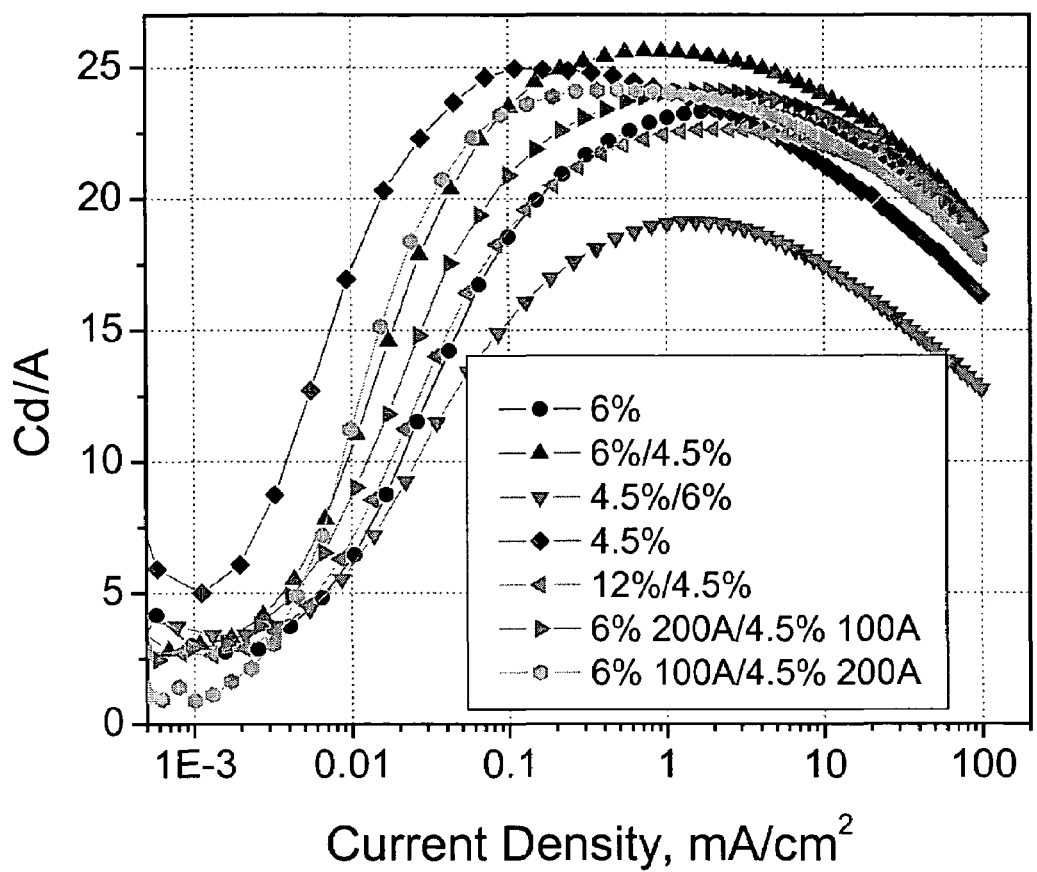
FIG. 7 shows the plot of luminous efficiency (Cd/A) vs current density (mA/cm$^2$) for Irppy/CBP OLEDs having the device structure ITO/CuPc(100 Å)/NPD(300 Å)/emissive layer (300 Å)/BAlq(100 Å)/Alq$_3$(400 Å)/LiF(10 Å)/Al(1000 Å) in which the emissive layer is (i) 6% Irppy:CBP(300 Å), (ii) 6% Irppy:CBP(150 Å)/4.5% Irppy:CBP(150 Å), (iii) 4.5% Irppy:CBP(150 Å)/6% Irppy:CBP(150 Å), (iv) 4.5% Irppy:CBP(300 Å), (v) 12% Irppy:CBP(150 Å)/4.5% Irppy:CBP(150 Å), (vi) 6% Irppy:CBP(200 Å)/4.5% Irppy:CBP (100 Å), or Irppy:CBP(100 Å)/4.5% Irppy:CBP(200 Å).
Figure 9:
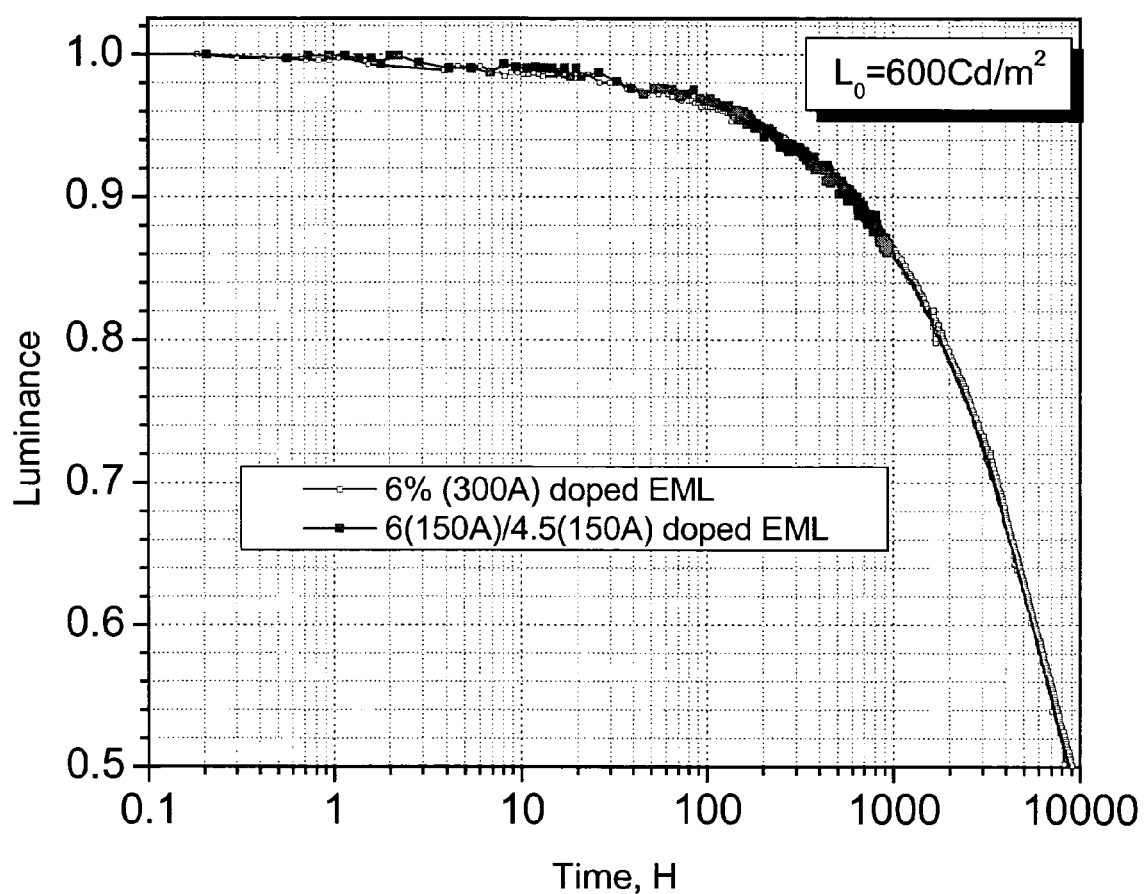
FIG. 9 shows the plot of the luminance (normalized to the initial luminance) vs operation time at room temperature for the OLEDs having the device structure ITO/CuPc(100 Å)/NPD(300 Å)/emissive layer (300 Å)/BAlq(100 Å)/Alq$_3$ (400 Å)/LiF(10 Å)/Al(1000 Å), in which the emissive layer is 6% Irppy:CBP(300 Å) or 6% Irppy:CBP(150 Å)/4.5% Irppy:CBP(150 Å) at an initial luminance of 600 Cd/m$^2$.

The dopant concentration and layer thickness, and device performance are shown in table 2. For the best performing devices, a higher dopant concentration was located close to the HTL to facilitate hole injection. Lower dopant concentration was located close to the ETL side, where the recombination mostly occurs, in order to facilitate the electron injection and to reduce the quenching of excitons. The efficiencies of selected Irppy/CBP devices are shown in the FIG. 7. FIG. 7 shows the plot of efficiency vs luminance for devices in which the emissive layer is (i) 6% Irppy:CBP(300 Å), (ii) 6% Irppy:CBP(150 Å)/4.5% Irppy:CBP(150 Å), (iii) 4.5% Irppy:CBP(150 Å)/6% Irppy:CBP(150 Å), (iv) 4.5% Irppy:CBP(300 Å), (v) 12% Irppy:CBP(150 Å)/4.5% Irppy: CBP(150 Å), (vi) 6% Irppy:CBP(200 Å)/4.5% Irppy:CBP (100 Å), or Irppy:CBP(100 Å)/4.5% Irppy:CBP(200 Å). The operational stability of selected devices are shown in FIG. 9. FIG. 9 shows the plot of the luminance vs operation time for devices in which the emissive layer is 6% Irppy:CBP(300 Å) or 6% Irppy:CBP(150 Å)/4.5% Irppy: CBP(150 Å).

The OLEDs having an emissive layer comprised of the two doped sublayers 6% 150 Å/4.5% 150 Å are much superior in terms of efficiency as compared to standard devices with only one dopant concentration. The lifetime of the devices with 6%/4.5% dopant concentration is comparable to the one for control devices with 6% uniform dopant concentration. The thickness of the layers 150 Å/150 Å was found optimal for the Ir(ppy):CBP devices.

The opposite effect of decreasing efficiency was demonstrated in the Irppy/CBP devices, where the dopant concentration on HTL side was lower than on HTL side (for example, 4.5% 150 Å/6% 150 Å). In this configuration the non-efficient charge utilization and increased exciton quenching lead to lower efficiency 19.1 Cd/A as compared to 25.6 Cd/A for the device with 6% 150 Å/4.5% 150 Å.

EXAMPLE 3

Figure 10:
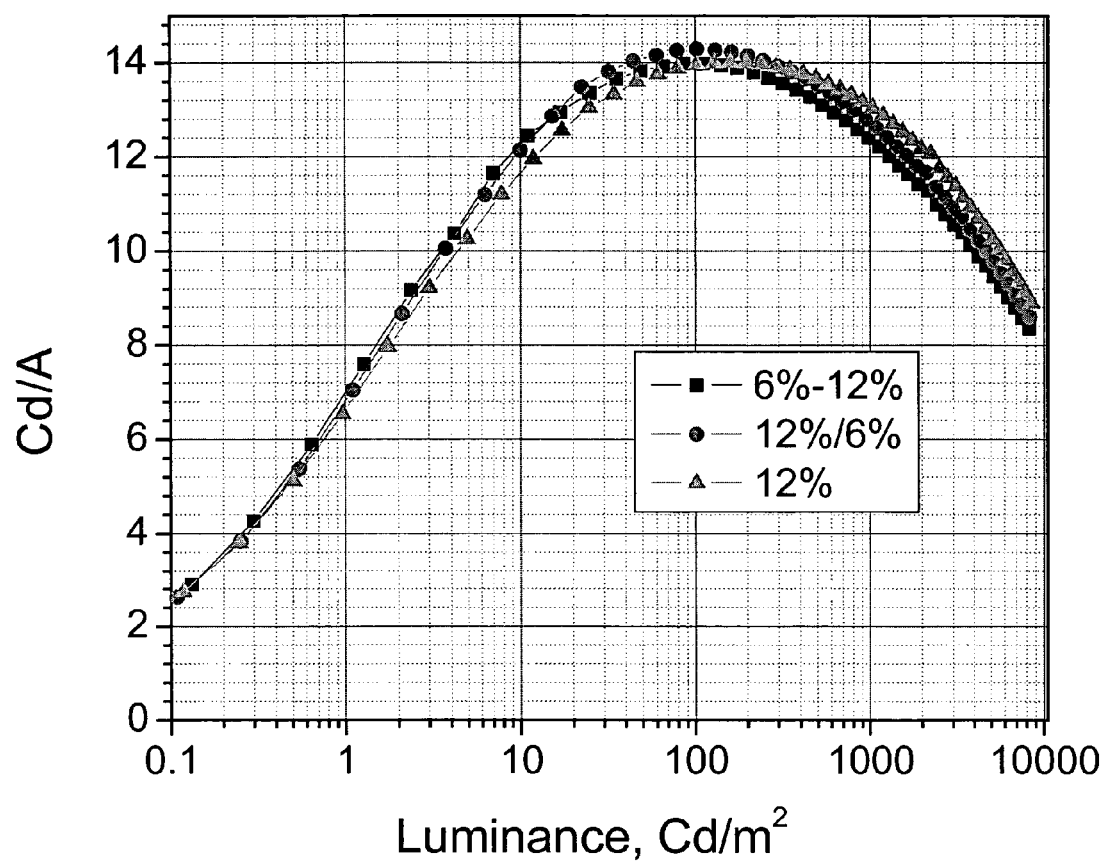
FIG. 10 shows the plot of luminous efficiency (Cd/A) vs luminance (Cd/m$^2$) for OLEDs having the device structure ITO/CuPc(100 Å)/NPD(400 Å)/emissive layer (300 Å)/BAlq(150 Å)/Alq$_3$(400 Å)/LiF(10 Å)/Al(1000 Å) in which the emissive layer is (i) 6% Ir(3-Mepq)$_2$(acac):CBP (150 Å)/12% for Ir(3-Mepq)$_2$(acac):CBP(150 Å), (ii) 12% Ir(3-Mepq)$_2$(acac):CBP(150 Å)/6% for Ir(3-Mepq)$_2$(acac): CBP(150 Å), or (iii) 12% Ir(3-Mepq)$_2$(acac):CBP(150 Å).
Figure 11:
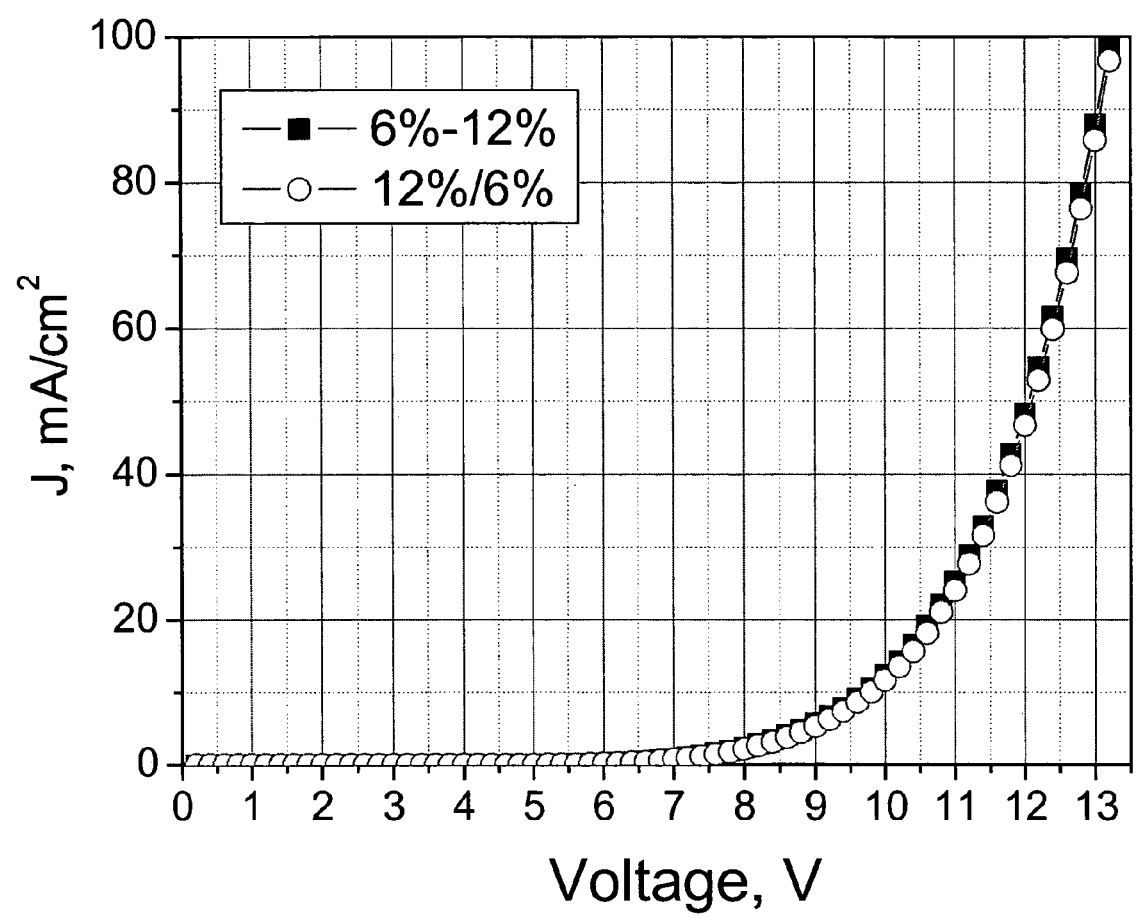
FIG. 11 shows the plot of current density (mA/cm$^2$) vs voltage (V) for OLEDs having the device structure ITO/ CuPc(100 Å)/NPD(400 Å)/emissive layer (300 Å)/BAlq (150 Å)/Alq$_3$(400 Å)/LiF(10 Å)/Al(1000 Å) in which the emissive layer is (i) 6% Ir(3-Mepq)$_2$(acac):CBP(150 Å)/12% for Ir(3-Mepq)$_2$(acac):CBP(150 Å), or (ii) 12% Ir(3-Mepq)$_2$(acac):CBP(150 Å)/6% for Ir(3-Mepq)$_2$(acac): CBP(150 Å).
Figure 12:
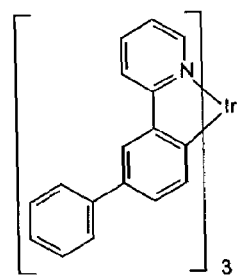
FIG. 12 shows the chemical structures of iridium(III)tris (2-[3-biphenyl]pyridine)(Ir(Ph-ppy)$_3$, IrPh-ppy), iridium (III)bis[2-(3-methyl-2-quinolinyl)-'N)phenyl-'C](2,4-pentanedionato-'O,'O')(Ir(3-Mepq)$_2$(acac)), tris(2-phenylpyridine)-iridium (Ir(ppy)$_3$, Irppy), 4,4'-N,N-dicarbazole-biphenyl (CBP), N,N'-diphenyl-N—N'-di(1-naphthyl)-benzidine (α-NPD, NPD), aluminum(III)bis(2- methyl-8-quinolinato)4-phenylphenolate (BAlq), 8-tris-hydroxyquinoline aluminum ($Alq_3$), and copper phthalocyanine (CuPc).
Figure 12:
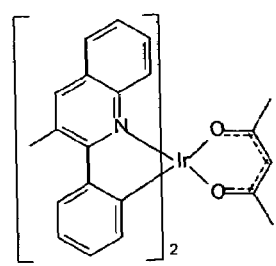
Figure 12:
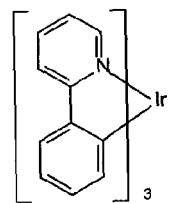
Figure 12:
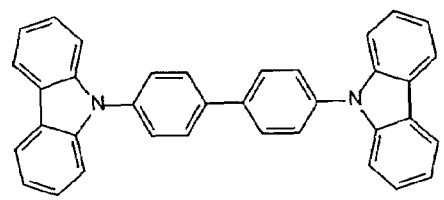
Figure 12:
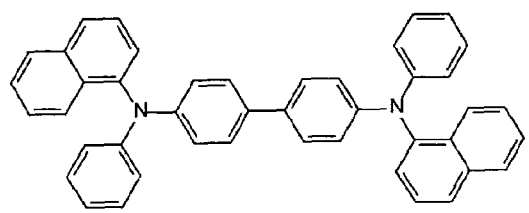
Figure 12:
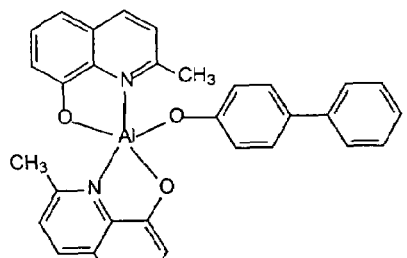
Figure 12:
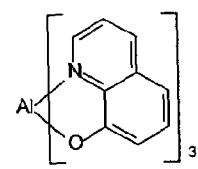
Figure 12:
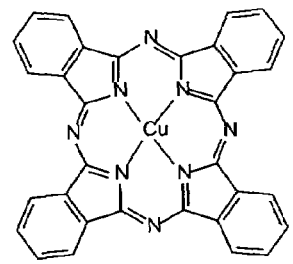

Phosphorescent OLEDs were fabricated having the device structure ITO/CuPc(100 Å)/NPD(400 Å)/emissive layer (300 Å)/BAlq(150 Å)/Alq$_3$(400 Å)/LiF(10 Å)/Al(1000 Å). The emissive layer comprised two doped sublayers, each with a CBP host doped with different concentrations of the phosphorescent dopant, Ir(3-Mepq)$_2$(acac). For comparison, devices were fabricated having a single layer uniformly doped emissive layer of Ir(3-Mepq)$_2$(acac) doped into CBP. FIG. 10 shows the plot of efficiency vs luminance OLEDs in which the emissive layer is (i) 6% Ir(3-Mepq)$_2$(acac):CBP (150 Å)/12% for Ir(3-Mepq)$_2$(acac):CBP(150 Å), (ii) 12% Ir(3-Mepq)$_2$(acac):CBP(150 Å)/6% for Ir(3-Mepq)$_2$(acac):CBP(150 Å), or (iii) 12% Ir(3-Mepq)$_2$(acac):CBP(150 Å). FIG. 11 shows the plot of current density vs voltage for OLEDs in which the emissive layer is (i) 6% Ir(3-Mepq)$_2$(acac):CBP(150 Å)/12% for Ir(3-Mepq)$_2$(acac):CBP(150 Å), or (ii) 12% Ir(3-Mepq)$_2$(acac):CBP(150 Å)/6% for Ir(3-Mepq)$_2$(acac):CBP(150 Å).

In the case of the Ir(3-Mepq)$_2$(acac) dopant, the difference in efficiency and voltage between the devices with 12/6% and 6/12% dopant concentration 150 Å/150 Å double doped EML was not as significant as compared to Irppy and IrPh-ppy dopants. Without being bound to any particular theory, this can be explained on the basis that Ir(3-Mepq)$_2$ (acac) doped into CBP transports both charge carriers (holes and electrons) due to the HOMO and LUMO energy levels of Ir(3-Mepq)$_2$(acac) relative to CBP.

By providing an emissive layer having a non-uniform emissive dopant concentration in the organic light emitting devices disclosed herein it was possible to increase device efficiency by about 10% to 20% over devices having a uniformly doped emissive layer. Such an improvement in efficiency could have significant value for commercially practical devices for which energy efficiency is a primary consideration. Furthermore, it is expected that optimization of this differential doping effect, which combines efficient charge injection and utilization with a reduction of exciton quenching, will provide even greater improvements in efficiency for selected devices.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device comprising an emissive layer disposed between and electrically connected to an anode and a cathode, wherein the emissive layer comprises a host material and a phosphorescent emissive material, and wherein the concentration of the phosphorescent emissive material in the host material on the anode-side of the emissive layer is about 1% to about 50%, the concentration of the phosphorescent emissive material in the host material on the cathode-side of the emissive layer is about 0.5% to about 20%, and the difference between the concentrations of the phosphorescent emissive material in the host material on the anode-side of the emissive layer and the cathode side of the emissive layer is at least about 0.5%.

2. The organic light emitting device of claim 1, wherein the concentration of the phosphorescent emissive material in the host material on the anode-side of the emissive layer is about 5% to about 20%, and the concentration of the phosphorescent emissive material in the host material on the cathode-side of the emissive layer is about 1% to about 6%.

3. The organic light emitting device of claim 2, wherein the concentration of the phosphorescent emissive material in the host material on the anode-side of the emissive layer is about 6% to about 12%.

4. The organic light emitting device of claim 3, wherein the concentration of the phosphorescent emissive material in the host material on the cathode-side of the emissive layer is about 2% to about 4.5%.

5. The organic light emitting device of claim 1, wherein the phosphorescent emissive material is present in the host material as a concentration gradient.

6. The organic light emitting device of claim 1; wherein the emissive layer is comprised of a first sublayer and a second sublayer each of which comprises the phosphorescent emissive material and the host material, wherein the first sublayer is adjacent to the second sublayer;
the first sublayer is situated on the anode-side of the emissive layer;
the second sublayer is situated on the cathode side of the emissive layer; and the concentration of the phosphorescent emissive material in the host material is higher in the first sublayer and lower in the second sublayer.

7. The organic light emitting device of claim 1, wherein the phosphorescent emissive material has a HOMO level that is lower in energy than that of the host material.

8. The organic light emitting device of claim 6, wherein the host material has a LUMO energy level that is lower in energy than that of the phosphorescent emissive material.

9. The organic light emitting device of claim 1, wherein exciton formation occurs in a region of the emissive layer such that the distance from the region of exciton formation to the boundaries of the emissive layer is greater than 50% of the exciton diffusion length.

10. The organic light emitting device of claim 9, wherein the emissive region is less than about 30 nm in thickness.

11. The organic light emitting device of claim 10, wherein the emissive region is less than about 20 nm in thickness.

12. An organic light emitting device comprising an emissive layer disposed between and electrically connected to an anode and a cathode, wherein the emissive layer comprises a host material and a phosphorescent emissive material, and wherein the concentration of the phosphorescent emissive material in the host material on the anode-side of the emissive layer is about 1% to about 50%, the concentration of the phosphorescent emissive material in the host material on the cathode-side of the emissive layer is about 0.5% to about 20%, and the ratio of the concentrations of the phosphorescent emissive material in the host material on the anode-side of the emissive layer to the cathode side of the emissive layer is at least about 1.25:1.

13. The organic light emitting device of claim 12, wherein the concentration of the phosphorescent emissive material in the host material on the anode-side of the emissive layer is about 5% to about 20%, and the concentration of the phosphorescent emissive material in the host material on the cathode-side of the emissive layer is about 1% to about 6%.

14. The organic light emitting device of claim 13, wherein the concentration of the phosphorescent emissive material in the host material on the anode-side of the emissive layer is about 6% to about 12%.

15. The organic light emitting device of claim 14, wherein the concentration of the phosphorescent emissive material in the host material on the cathode-side of the emissive layer is about 2% to about 4.5%.

16. The organic light emitting device of claim 12, wherein the phosphorescent emissive material is present in the host material as a concentration gradient.

17. The organic light emitting device of claim 12, wherein the emissive layer is comprised of a first sublayer and a second sublayer each of which comprises the phosphorescent emissive material and the host material, wherein
 the first sublayer is adjacent to the second sublayer;
 the first sublayer is situated on the anode-side of the emissive layer;
 the second sublayer is situated on the cathode side of the emissive layer; and
the concentration of the phosphorescent emissive material in the host material is higher in the first sublayer and lower in the second sublayer.

18. The organic light emitting device of claim 12, wherein the phosphorescent emissive material has a HOMO energy level that is higher than that of the host material.

19. The organic light emitting device of claim 18, wherein the host material has a LUMO energy level that is lower than that of the phosphorescent emissive material.

20. The organic light emitting device of claim 12, wherein exciton formation occurs in a region of the emissive layer such that the distance from the region of exciton formation to the boundaries of the emissive layer is greater 50% of the exciton diffusion length.

21. The organic light emitting device of claim 20, wherein the emissive region is less than about 30 nm in thickness.

22. The organic light emitting device of claim 21, wherein the emissive region is less than about 20 nm in thickness.

23. An organic light emitting device comprising an emissive layer disposed between and electrically connected to an anode and a cathode, wherein the emissive layer comprises a host material and a phosphorescent emissive material, and wherein the concentration of the phosphorescent emissive material in the host material on the cathode-side of the emissive layer is about 1% to about 50%, the concentration of the phosphorescent emissive material in the host material on the anode-side of the emissive layer is about 0.5% to about 20%, and the difference between the concentrations of the phosphorescent emissive material in the host material on the cathode-side of the emissive layer and the anode-side of the emissive layer is at least about 0.5%.

24. The organic light emitting device of claim 23, wherein the concentration of the phosphorescent emissive material in the host material on the cathode-side of the emissive layer is about 5% to about 20%, and the concentration of the phosphorescent emissive material in the host material on the anode-side of the emissive layer is about 1% to about 6%.

25. The organic light emitting device of claim 24, wherein the concentration of the phosphorescent emissive material in the host material on the cathode-side of the emissive layer is about 6% to about 12%.

26. The organic light emitting device of claim 25, wherein the concentration of the phosphorescent emissive material in the host material on the anode-side of the emissive layer is about 2% to about 4.5%.

27. The organic light emitting device of claim 23, wherein the phosphorescent emissive material is present in the host material as a concentration gradient.

28. The organic light emitting device of claim 23, wherein the emissive layer is comprised of a first sublayer and a second sublayer each of which comprises the phosphorescent emissive material and the host material, wherein
 the first sublayer is adjacent to the second sublayer;
 the first sublayer is situated on the anode-side of the emissive layer;
 the second sublayer is situated on the cathode side of the emissive layer; and
the concentration of the phosphorescent emissive material in the host material is higher in the second sublayer and lower in the first sublayer.

29. The organic light emitting device of claim 23, wherein exciton formation occurs in a region of the emissive layer such that the distance from the region of exciton formation to the boundaries of the emissive layer is greater than the exciton diffusion length.

30. The organic light emitting device of claim 29, wherein the emissive region is less than about 30 nm in thickness.

31. The organic light emitting device of claim 30, wherein the emissive region is less than about 20 nm in thickness.

32. An organic light emitting device comprising an emissive layer disposed between and electrically connected to an anode and a cathode, wherein the emissive layer comprises a host material and a phosphorescent emissive material, and wherein the concentration of the phosphorescent emissive material in the host material on the cathode-side of the emissive layer is about 1% to about 50%, the concentration of the phosphorescent emissive material in the host material on the anode-side of the emissive layer is about 0.5% to about 20%, and the ratio of the concentrations of the phosphorescent emissive material in the host material on the cathode-side of the emissive layer to the anode-side of the emissive layer is at least about 1.25:1.

33. The organic light emitting device of claim 32, wherein the concentration of the phosphorescent emissive material in the host material on the cathode-side of the emissive layer is about 5% to about 20%, and the concentration of the phosphorescent emissive material in the host material on the anode-side of the emissive layer is about 1% to about 6%.

34. The organic light emitting device of claim 33, wherein the concentration of the phosphorescent emissive material in the host material on the cathode-side of the emissive layer is about 6% to about 12%.

35. The organic light emitting device of claim 34, wherein the concentration of the phosphorescent emissive material in the host material on the anode-side of the emissive layer is about 2% to about 4.5%.

36. The organic light emitting device of claim 32, wherein the phosphorescent emissive material is present in the host material as a concentration gradient.

37. The organic light emitting device of claim 32, wherein the emissive layer is comprised of a first sublayer and a second sublayer each of which comprises the phosphorescent emissive material and the host material, wherein
the first sublayer is adjacent to the second sublayer;
the first sublayer is situated on the anode-side of the emissive layer;
the second sublayer is situated on the cathode side of the emissive layer; and the concentration of the phosphorescent emissive material in the host material is higher in the second sublayer and lower in the first sublayer.

38. The organic light emitting device of claim 32, wherein exciton formation occurs in a region of the emissive layer such that the distance from the region of exciton formation to the boundaries of the emissive layer is greater than 50% of the exciton diffusion length.

39. The organic light emitting device of claim 38, wherein the emissive region is less than about 30 nm in thickness.

40. The organic light emitting device of claim 39, wherein the emissive region is less than about 20 nm in thickness.

41. An organic light emitting device comprising an emissive layer disposed between and electrically connected to an anode and a cathode, wherein the emissive layer comprises a first sublayer, a second sublayer and a third sublayer, each of which comprises a host material and a phosphorescent emissive material, wherein:
the first sublayer is on the anode-side of the emissive layer and the concentration of the phosphorescent emissive material in the host material in the first sublayer is about 1% to about 50%;
the third sublayer is on the cathode-side of the emissive layer and the concentration of the phosphorescent emissive material in the host material in the third sublayer is about 1% to about 50%; and
the second sublayer is disposed between the first sublayer and the third sublayer, and the concentration of the phosphorescent emissive material in the second sublayer is about 0.5% to about 20%;
and wherein
the difference between the concentrations of the phosphorescent emissive material in the host material in the first sublayer and in the second sublayer is at least about 0.5%, wherein the first sublayer has a higher concentration of the phosphorescent emissive material than the second sublayer, and
the difference between the concentrations of the phosphorescent emissive material in the host material in the third sublayer and the second sublayer is at least about 0.5%, wherein the third sublayer has a higher concentration of the phosphorescent emissive material than the second sublayer.

42. An organic light emitting device comprising an emissive layer disposed between and electrically connected to an anode and a cathode, wherein the emissive layer comprises a first sublayer, a second sublayer and a third sublayer, each of which comprises a host material and a phosphorescent emissive material, wherein:
the first sublayer is on the anode-side of the emissive layer and the concentration of the phosphorescent emissive material in the host material in the first sublayer is about 1% to about 50%;
the third sublayer is on the cathode-side of the emissive layer and the concentration of the phosphorescent emissive material in the host material in the third sublayer about is 1% to about 50%; and
the second sublayer is disposed between the first sublayer and the third sublayer, and the concentration of the phosphorescent emissive material in the second sublayer is about 0.5% to about 20%;
and wherein the ratio of the concentrations of the phosphorescent emissive material in the host material in the first sublayer and in the second sublayer is at least about 1.25:1, and the ratio of the concentrations of the phosphorescent emissive material in the host material in the third sub layer and in the second sublayer is at least about 1.25:1.

* * * * *